US012652021B2

(12) United States Patent
Ozasa

(10) Patent No.: US 12,652,021 B2
(45) Date of Patent: Jun. 9, 2026

(54) MULTIPLEXER

(71) Applicant: Murata Manufacturing Co., Ltd.,
Nagaokakyo (JP)

(72) Inventor: Motoki Ozasa, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 279 days.

(21) Appl. No.: 18/370,645

(22) Filed: Sep. 20, 2023

(65) Prior Publication Data

US 2024/0106414 A1 Mar. 28, 2024

(30) Foreign Application Priority Data

Sep. 27, 2022 (JP) ................................. 2022-153419

(51) Int. Cl.
*H03H 9/64* (2006.01)
*H03H 9/13* (2006.01)
*H03H 9/54* (2006.01)

(52) U.S. Cl.
CPC .......... *H03H 9/6403* (2013.01); *H03H 9/131*
(2013.01); *H03H 9/542* (2013.01)

(58) Field of Classification Search
CPC .. H03H 9/54; H03H 9/64; H03H 9/70; H03H
9/72
See application file for complete search history.

(56) References Cited

U.S. PATENT DOCUMENTS

| | | | | |
|---|---|---|---|---|
| 7,646,265 B2 * | 1/2010 | Stuebing | ................ | H03H 9/542 |
| | | | | 333/133 |
| 9,912,370 B2 * | 3/2018 | Uejima | .................. | H03H 7/465 |
| 10,931,253 B2 * | 2/2021 | Ta | ......................... | H03H 9/6483 |
| 11,095,321 B2 * | 8/2021 | Hisano | ................... | H03H 9/725 |
| 12,034,464 B2 * | 7/2024 | Tani | ........................ | H03H 7/463 |
| 12,176,885 B2 * | 12/2024 | Nishio | ...................... | H04B 1/40 |
| 12,445,111 B2 * | 10/2025 | Nishio | ................ | H03H 9/0576 |
| 2019/0393862 A1 | 12/2019 | Okada | | |
| 2020/0186119 A1 * | 6/2020 | Yamamoto | ......... | H03H 9/02866 |

FOREIGN PATENT DOCUMENTS

JP 2019-220877 A 12/2019

* cited by examiner

*Primary Examiner* — Andrea Lindgren Baltzell
*Assistant Examiner* — Alan Wong
(74) *Attorney, Agent, or Firm* — Keating & Bennett, LLP

(57) ABSTRACT

A multiplexer includes a common terminal, an inductor
including a first end connected to the common terminal and
a second end, a filter connected to the second end and having
a first pass band, a filter connected to the common terminal
and having a second pass band located on a higher frequency
side relative to the first pass band, an inductor connected
between a ground and a path that links the second end to the
filter, and a capacitor connected between the path and the
ground. A resonant frequency of an LC parallel resonance
circuit including the inductor and the capacitor is located
between the first pass band and the second pass band.

18 Claims, 12 Drawing Sheets

FIG. 2

ACOUSTIC WAVE
PROPAGATION
DIRECTION 58
54

57

68
67
66 ↑ ACOUSTIC     WAVE
PROPAGATION
DIRECTION

65

MULTIPLEXER

CROSS REFERENCE TO RELATED APPLICATIONS

This application claims the benefit of priority to Japanese Patent Application No. 2022-153419 filed on Sep. 27, 2022. The entire contents of this application are hereby incorporated herein by reference.

BACKGROUND OF THE INVENTION

1. Field of the Invention

The present invention relates to a multiplexer that includes an acoustic wave filter.

2. Description of the Related Art

Japanese Unexamined Patent Application Publication No. 2019-220877 discloses a multiplexer which includes an inductance element of which one end is connected to a first common terminal and the other end is connected to a second common terminal, a first acoustic wave filter (a first pass band) connected to the first common terminal without the inductance element interposed therebetween and having a first pass band, and a second acoustic wave filter connected to the second common terminal and having a second pass band being on a lower frequency side relative to the first pass band. According to this multiplexer, an inductive impedance in the second pass band of the second acoustic wave filter to which the inductance element is connected and a capacitive impedance in the second pass band of the first acoustic wave filter have a complex conjugate relationship, so that an impedance in a second pass band of the multiplexer can be matched with a reference impedance.

SUMMARY OF THE INVENTION

However, according to the multiplexer disclosed in Japanese Unexamined Patent Application Publication No. 2019-220877, the impedance in the second pass band of the second acoustic wave filter after adding the inductance element thereto is located in an inductive region far from the reference impedance when the impedance in the second pass band of the second acoustic wave filter alone is located in a region where a capacitance component is large. For this reason, an imbalance is caused between the aforementioned inductive impedance in the second pass band of the second acoustic wave filter to which the inductance element is connected and the capacitive impedance in the second pass band of the first acoustic wave filter, which poses a problem that the impedance in the second pass band of the multiplexer cannot be matched accurately with the reference impedance. As a consequence, a matching loss occurs in the second pass band whereby an insertion loss of the multiplexer is increased.

Preferred embodiments of the present invention provide multiplexers each with a reduced insertion loss in a pass band of each of acoustic wave filters connected in common.

Accordingly, a preferred embodiment of the present invention provides a multiplexer including a common terminal, a first inductance element including a first end connected to the common terminal and a second end, a first acoustic wave filter connected to the second end and having a first pass band, a second acoustic wave filter connected to the common terminal and having a second pass band located on a higher frequency side relative to the first pass band, a second inductance element connected between a ground and a path that links the second end to the first acoustic wave filter, and a capacitance element connected between the path and the ground, in which a resonant frequency of a resonance circuit including the second inductance element and the capacitance element is located between the first pass band and the second pass band.

According to preferred embodiments of the present invention, it is possible to provide multiplexers each with a reduced insertion loss in a pass band of each of acoustic wave filters connected in common.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
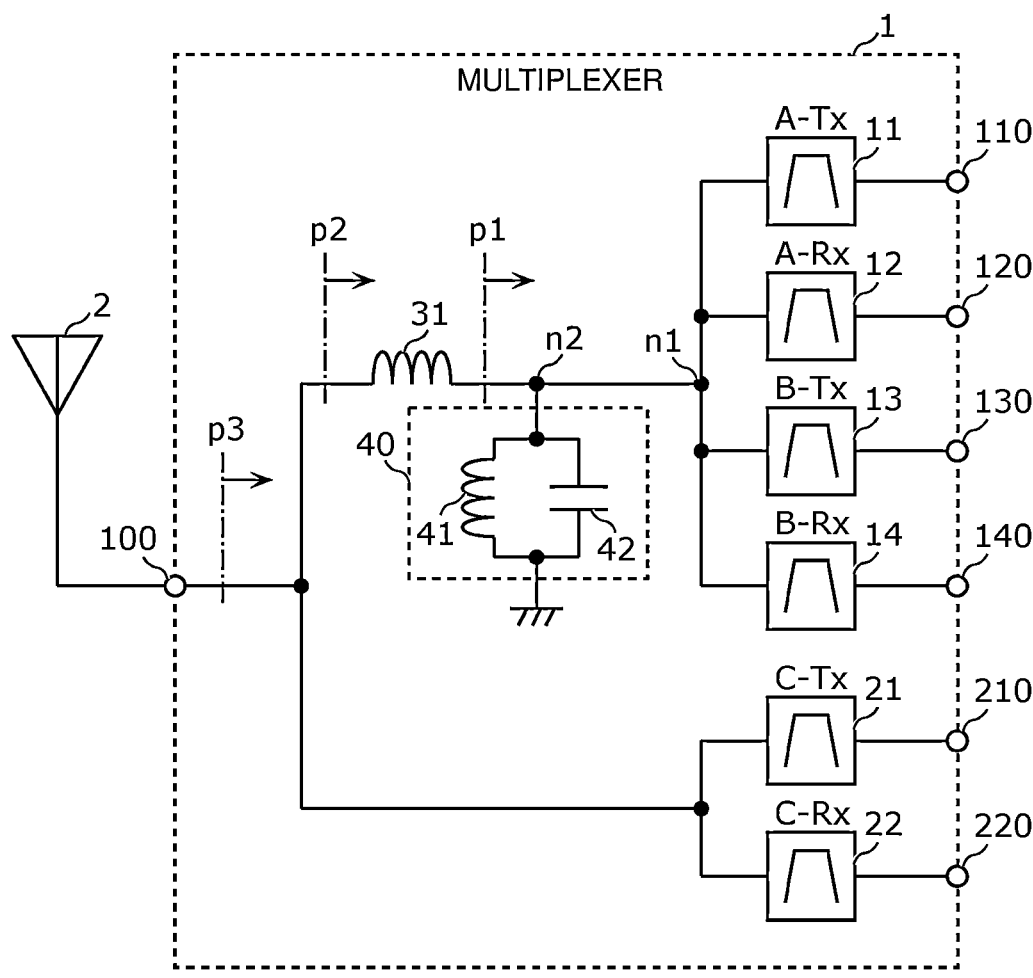
FIG. 1 is a circuit configuration diagram of a multiplexer according to an example of a preferred embodiment of the present invention.

Preferred embodiments of the present disclosure will be described below in detail with reference to an example, modified examples, and drawings. Note that each of the example and the modified examples to be described below represents a comprehensive or specific example. Numerical values, shapes, materials, elements, layouts of the elements, modes of connection of the elements, and the like discussed below in the example and the modified examples are mere examples and are not intended to restrict the present invention. Among the elements discussed below in the example and the modified examples, those not defined in an independent claim will be explained as optional elements. Moreover, sizes and ratios of sizes of the elements illustrated in the drawings are not always strictly accurate.

Meanwhile, the respective drawings are schematic drawings which are not necessarily illustrated with precision but are instead subjected to appropriate emphasis, omission, or adjustment of ratios in order to demonstrate the present invention. Accordingly, the drawings may be different from actuality in light of shapes, positional relations and ratios illustrated therein. In the respective drawings, virtually the same elements are denoted by the same reference signs and duplicate explanations may be omitted or simplified as appropriate.

In circuit configurations of preferred embodiments of the present disclosure, a description "connected" means not only a state of being directly connected to a connection terminal and/or a wiring conductor but also a state of being electrically connected with another circuit element interposed therebetween. A description "connected between A and B" means a state of being located between A and B and connected to both A and B.

Meanwhile, terms that represent relations between the elements such as "parallel" and "perpendicular", terms that represent shapes of the elements such as "rectangular", and numerical ranges represent not only strict meanings but also virtually equivalent ranges that cover differences in several percent, for example.

In the following description of preferred embodiments of the present invention, a pass band of a filter is defined as a frequency band between two frequencies each being larger by about 3 dB than a minimum value of an insertion loss in the pass band.

In the present disclosure, a description "two impedances have a complex conjugate relationship" means that complex components of two impedances being combined are cancelled so as to approach 0. That is to say, this description means that $X_1 > 0$ and $X_2 < 0$ are satisfied in a case where a first impedance is defined as $R_1 + jX_1$ and a second impedance is defined as $R_2 + jX_2$ (where the first impedance is inductive and the second impedance is capacitive). In particular, it is preferable to satisfy $X_1 + X_2 = 0$.

PREFERRED EMBODIMENT 1.1 Circuit Configuration of Multiplexer 1

FIG. 1 is a circuit configuration diagram of a multiplexer 1 according to an example of a preferred embodiment of the present invention. As shown in FIG. 1, the multiplexer 1 includes filters 11, 12, 13, 14, 21, and 22, an inductor 31, an LC parallel resonance circuit 40, a common terminal 100, input terminals 110, 130, and 210, and output terminals 120, 140, and 220.

The common terminal 100 is connected to an antenna 2, for example.

The inductor 31 is an example of a first inductance element that includes a first end and a second end. The first end of the inductor 31 is connected to the common terminal 100.

The filter 11 is an example of a first acoustic wave filter and has a pass band (a first pass band) that includes a transmission band (an uplink operating band) of a band A. One end (an output end) of the filter 11 is connected to the second end of the inductor 31, and the other end (an input end) thereof is connected to the input terminal 110. The filter 11 includes one or more acoustic wave resonators.

The filter 12 is an example of a third acoustic wave filter and has a pass band (a third pass band) that includes a reception band (a downlink operating band) of the band A. One end (an input end) of the filter 12 is connected to the second end of the inductor 31, and the other end (an output end) thereof is connected to the output terminal 120. The filter 12 includes one or more acoustic wave resonators.

The filter 13 has a pass band that includes a transmission band (an uplink operating band) of a band B. One end (an output end) of the filter 13 is connected to the second end of the inductor 31, and the other end (an input end) thereof is connected to the input terminal 130. The filter 13 includes one or more acoustic wave resonators.

The filter 14 has a pass band that includes a reception band (a downlink operating band) of the band B. One end (an input end) of the filter 14 is connected to the second end of the inductor 31, and the other end (an output end) thereof is connected to the output terminal 140. The filter 14 includes one or more acoustic wave resonators.

The filters 11, 12, 13, and 14 define a first filter group connected in common to the second end of the inductor 31.

The filter 21 is an example of a second acoustic wave filter and has a pass band (a second pass band) that includes a transmission band (an uplink operating band) of a band C. One end (an output end) of the filter 21 is connected to the common terminal 100, and the other end (an input end) thereof is connected to the input terminal 210. The filter 21 includes one or more acoustic wave resonators.

The filter 22 has a pass band that includes a reception band (a downlink operating band) of the band C. One end (an input end) of the filter 22 is connected to the common terminal 100, and the other end (an output end) thereof is connected to the output terminal 220. The filter 22 includes one or more acoustic wave resonators.

The filters 21 and 22 define a second filter group connected in common to the common terminal 100.

Figure 2:
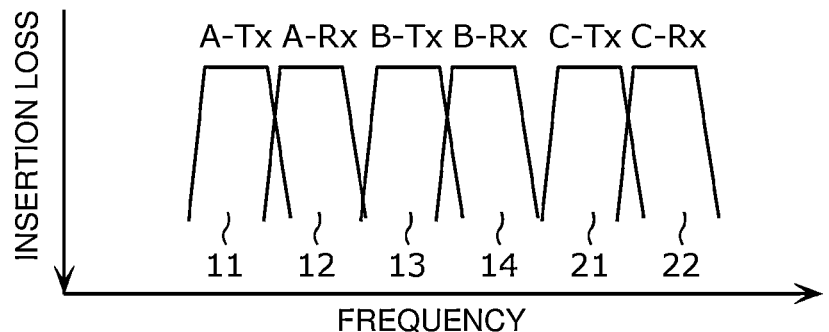
FIG. 2 is a diagram showing a relation of frequencies among respective filters according to an example of a preferred embodiment of the present invention.

FIG. 2 is a diagram showing a relation of frequencies among the respective filters according to an example of a preferred embodiment of the present invention. FIG. 2 illustrates outlines of bandpass characteristics of the filters 11 to 14, 21, and 22. As shown in FIG. 2, the pass bands of the respective filters are arranged as the filters 11, 12, 13, 14, 21, and 22 in the increasing order of the frequency.

That is to say, the respective pass bands of the second filter group (the filters 21 and 22) are located on the higher frequency side relative to the respective pass bands of the first filter group (the filters 11 to 14).

Note that the relation of frequencies of the pass bands may be appropriately set within the first filter group (the filters 11 to 14) and the relation of frequencies of the pass bands may be appropriately set within the second filter group (the filters 21 and 22).

Here, Band 3 (transmission band: 1710 to 1785 MHz, reception band: 1805 to 1880 MHz) of the Long Term Evolution (LTE) is applied to the band A, for example. Meanwhile, Band 1 (transmission band: 1920 to 1980 MHz, reception band: 2110 to 2170 MHz) of the LTE is applied to the band B, for example. In the meantime, Band 7 (transmission band: 2500 to 2570 MHz, reception band: 2620 to 2690 MHz) of the LTE is applied to the band C, for example.

Note that the multiplexer 1 according to the present example of a preferred embodiment of the present invention does not always have to include the filters 12 to 14 and 22. Meanwhile, filters other than the filters 11 to 14 may be connected to the second end of the inductor 31, or the filters other than the filters 21 and 22 may be connected to the common terminal 100. However, the pass band of each filter connected to the second end of the inductor 31 needs to be located on the lower frequency side relative to the pass band of each filter directly connected to the common terminal 100.

The LC parallel resonance circuit 40 is an example of a resonance circuit, which is connected between a ground and a node n2 on a path that links the second end of the inductor 31 to the filter 11, and includes an inductor 41 and a capacitor 42. The inductor 41 is an example of a second inductance element which is connected between the node n2 and the ground. The capacitor 42 is an example of a capacitance element which is connected between the node n2 and the ground. That is to say, the inductor 41 and the capacitor 42 are connected in parallel between the path and the ground. In the present example of a preferred embodiment of the present invention, the node n2 is located between the second end of the inductor 31 and a node n1 to which the filters 11 to 14 are connected in common.

Here, each of the inductors 31 and 41 may be an inductance element as typified by a surface-mounted component in the form of a chip, a conductor coil or a conductor wiring line provided to a substrate, and the like. Meanwhile, the capacitor 42 may be a capacitance element as typified by a surface-mounted component in the form of a chip, a conductor electrode or a conductor wiring line provided to a substrate, and the like.

Figure 3:
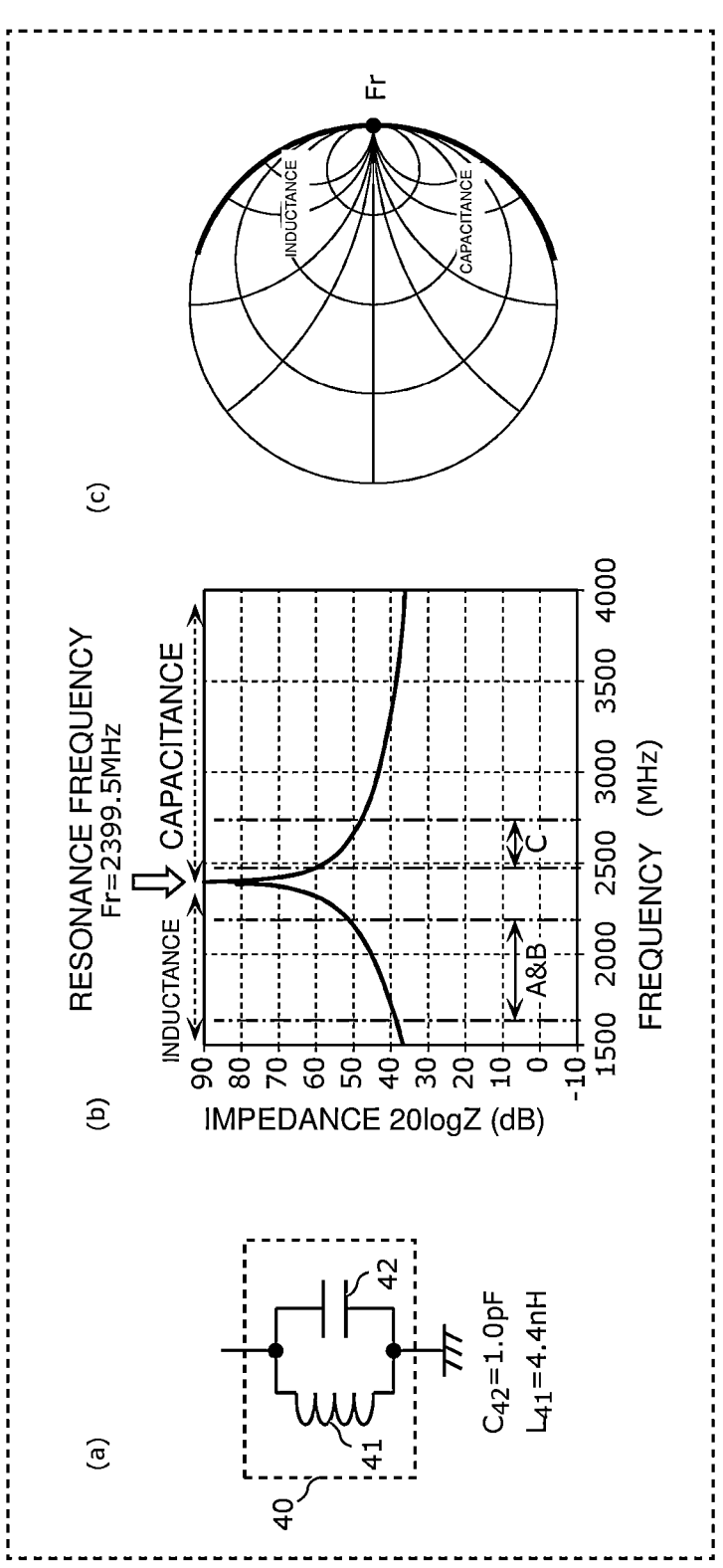
FIG. 3 illustrates diagrams showing resonance characteristics and impedance characteristics of an LC parallel resonance circuit according to an example of a preferred embodiment of the present invention.

FIGS. 3A-3C illustrate diagrams showing resonance characteristics and impedance characteristics of the LC parallel resonance circuit 40 according to an example of a preferred embodiment of the present invention. FIG. 3A shows a circuit diagram of the LC parallel resonance circuit 40 and examples of numerical values of the inductor 41 and the capacitor 42. Meanwhile, FIG. 3B shows frequency characteristics of the impedance of the LC parallel resonance circuit 40. In the meantime, FIG. 3C shows a Smith chart plotting the impedance of the LC parallel resonance circuit 40.

As shown in FIG. 3B, the impedance reaches a maximum at a resonant frequency Fr of the LC parallel resonance circuit 40. The resonant frequency Fr of the LC parallel resonance circuit 40 is about 2399.5 MHz, for example, by setting an inductance value $L_{41}$ of the inductor 41 to about 4.4 nH, for instance, and setting a capacitance value $C_{42}$ of the capacitor 42 to about 1.0 pF, for instance, as shown in FIG. 3A.

Here, the resonant frequency Fr of the LC parallel resonance circuit 40 is located between the respective pass bands of the first filter group (the filters 11 to 14) and the respective pass bands of the second filter group (the filters 21 and 22). According to this aspect, the impedance of the LC parallel resonance circuit 40 shows inductance on the lower frequency side relative to the resonant frequency Fr, and the impedance of the LC parallel resonance circuit 40 shows capacitance on the higher frequency side relative to the resonant frequency Fr.

Note that the multiplexer 1 does not always have to include the common terminals 100, the input terminals 110, 130, and 210, and the output terminals 120, 140, and 220.

1.2 Structure of Acoustic Wave Filter

Now, an example will be given of a structure of the acoustic wave resonator provided to each of the filters defining the multiplexer 1.

Figure 4A:
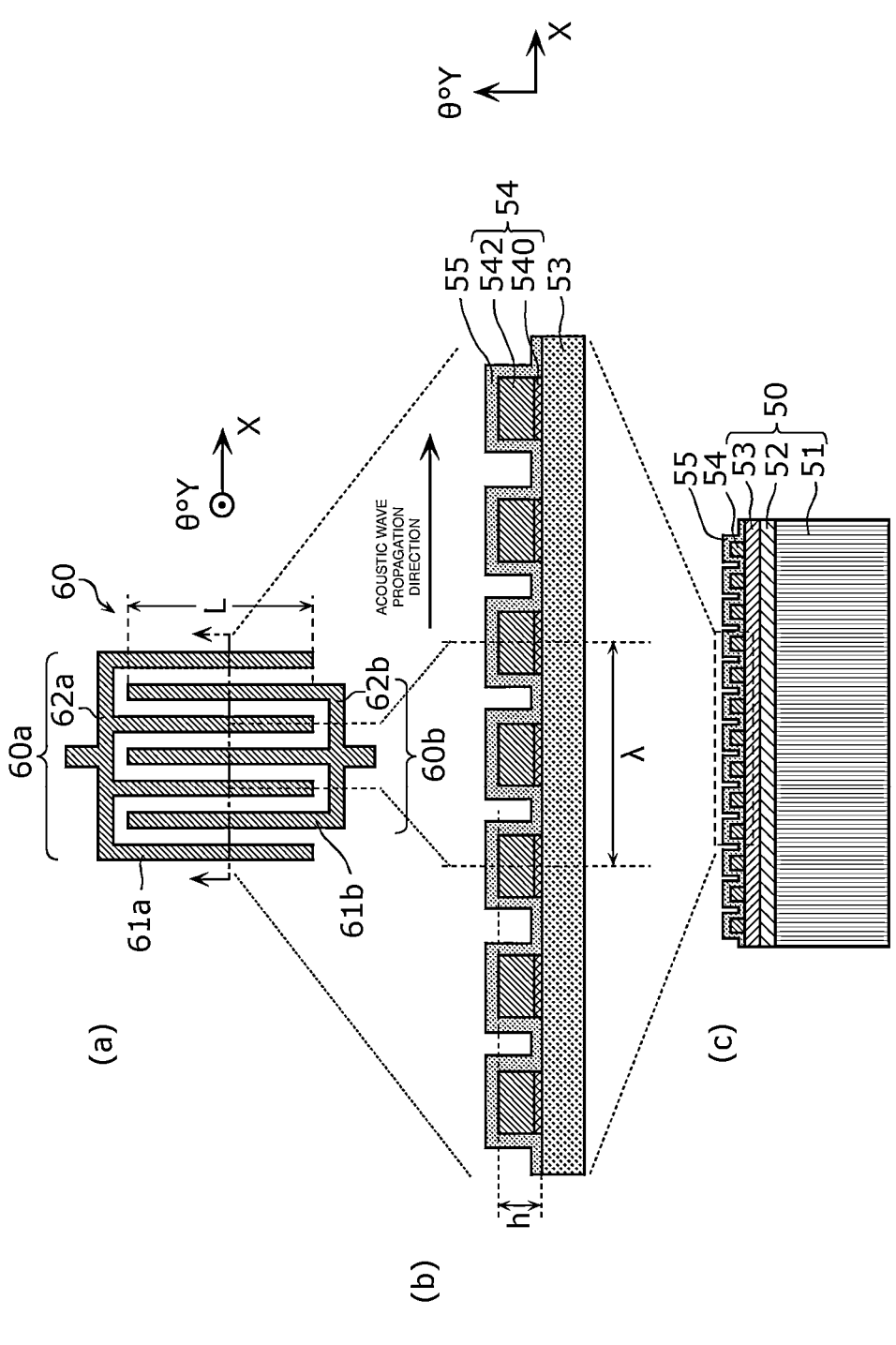
FIG. 4A illustrates a plan view and sectional views schematically showing a first example of an acoustic wave resonator defining each filter according to an example of a preferred embodiment of the present invention.

FIG. 4A illustrates a plan view and sectional views schematically showing a first example of the acoustic wave resonator defining each filter according to an example of a preferred embodiment of the present invention. FIG. 4A shows an example of a basic structure of the acoustic wave resonator defining each of the filters 11 to 14, 21, and 22. Note that an acoustic wave resonator 60 shown in FIG. 4A is illustrated for the purpose of explaining a typical structure of the acoustic wave resonator, and the number and lengths of electrode fingers defining each electrode therein are not limited thereto.

The acoustic wave resonator 60 includes a substrate 50 having piezoelectricity, and comb-shaped electrodes 60a and 60b.

As shown in FIG. 4A(a), the paired comb-shaped electrodes 60a and 60b opposed to each other are located on the substrate 50. The comb-shaped electrode 60a includes electrode fingers 61a that are parallel to one another and a busbar electrode 62a that connects the electrode fingers 61a to one another. Meanwhile, the comb-shaped electrode 60b includes electrode fingers 61b that are parallel to one another and a busbar electrode 62b that connects the electrode fingers 61b to one another. The electrode fingers 61a and 61b extend in a direction orthogonal to an acoustic wave propagation direction (X-axis direction).

Meanwhile, interdigital transducer (IDT) electrodes 54 including the electrode fingers 61a and 61b and the busbar electrodes 62a and 62b includes a multilayer structure that includes a close contact layer 540 and a main electrode layer 542 as shown in FIG. 4A(b).

The close contact layer 540 is a layer to improve close contact between the substrate 50 and the main electrode layer 542, which includes Ti as a material, for example. The main electrode layer 542 includes Al including about 1% of Cu as a material, for example. A protecting layer 55 is formed in such a way as to cover the comb-shaped electrodes 60a and 60b. The protecting layer 55 is a layer aimed at protection of the main electrode layer 542 from the external environment, adjustment of frequency-temperature characteristics, improvement of humidity resistance, and the like. The protecting layer 55 is a dielectric film that includes silicon dioxide as a main component, for example.

Note that the materials defining the close contact layer 540, the main electrode layer 542, and the protecting layer 55 are not limited to the aforementioned materials. Moreover, the IDT electrode 54 does not always have to include the above-mentioned multilayer structure. The IDT electrode 54 may include a metal such as Ti, Al, Cu, Pt, Au, Ag, and Pd or an alloy thereof. Alternatively, the IDT electrode 54 may include multilayer bodies including the aforementioned metal or the alloy. Also, it is not always essential to provide the protecting layer 55.

Next, a multilayer structure of the substrate 50 will be described.

As shown in FIG. 4A(c), the substrate 50 includes a high acoustic velocity support substrate 51, a low acoustic velocity film 52, and a piezoelectric film 53. The substrate 50 includes a structure in which the high acoustic velocity support substrate 51, the low acoustic velocity film 52, and the piezoelectric film 53 are laminated in this order.

For example, the piezoelectric film 53 includes a $0°$ rotated Y-cut X-propagation $LiTaO_3$ piezoelectric single-crystal or piezoelectric ceramic material (a lithium tantalate single crystal or ceramic material which is cut out along a plane normal to an axis rotated by $0°$ relative to the Y axis about the X axis serving as the center axis being the single crystal or ceramic material in which a surface acoustic wave propagates in the X-axis direction). Here, the piezoelectric single-crystal material to be used as the piezoelectric film 53 and the cut-angle $\theta$ thereof are appropriately selected depending on specifications required by each filter.

The high acoustic velocity support substrate 51 is a substrate that supports the low acoustic velocity film 52, the piezoelectric film 53, and the IDT electrode 54. Moreover, the high acoustic velocity support substrate 51 is the substrate that renders an acoustic velocity of a bulk wave in the high acoustic velocity support substrate 51 higher than that of an acoustic wave such as a surface acoustic wave and a boundary wave propagating in the piezoelectric film 53. The high acoustic velocity support substrate 51 has a function to confine the surface acoustic wave to a portion where the piezoelectric film 53 and the low acoustic velocity film 52 are laminated so as not to leak the surface acoustic wave below the high acoustic velocity support substrate 51. The high acoustic velocity support substrate 51 is a silicon substrate, for example.

The low acoustic velocity film 52 is a film that renders the acoustic velocity of the bulk wave in the low acoustic velocity film 52 lower than that of the bulk wave propagating in the piezoelectric film 53. The low acoustic velocity film 52 is disposed between the piezoelectric film 53 and the high acoustic velocity support substrate 51. This structure and the properties of the acoustic wave to concentrate its energy on a substantially low-velocity medium reduce or prevent of surface acoustic wave energy out of the IDT electrode. The low acoustic velocity film 52 is a film that includes silicon dioxide as a main component, for example.

According to the above-described multilayer structure of the substrate 50, it is possible to drastically increase Q values of a resonant frequency and an anti-resonant frequency as compared with the structure of the related art which includes the single layer of the piezoelectric substrate. In other words, since it is possible to construct the acoustic wave resonator having the high Q values, the filter with a small insertion loss can be constructed by using this acoustic wave resonator.

Here, the high acoustic velocity support substrate 51 may have a structure formed by laminating a support substrate and a high acoustic velocity film that renders the acoustic velocity of the bulk wave propagating therein higher than that of the acoustic wave such as the surface acoustic wave and the boundary wave propagating in the piezoelectric film

53. In this case, any of piezoelectric bodies such as sapphire, lithium tantalate, lithium niobate, and quartz, various ceramics such as alumina, magnesia, silicon nitride, aluminum nitride, silicon carbide, zirconia, cordierite, mullite, steatite, and forsterite, dielectric bodies such as glass, semiconductors such as silicon and gallium nitride, resin substrates, and the like can be used as the support substrate. In the meantime, various high acoustic velocity materials including aluminum nitride, aluminum oxide, silicon carbide, silicon nitride, silicon oxynitride, a DLC film, diamond, a medium including any of these materials as a main component, a medium including a mixture of any of these materials as a main component, and the like can be used for the high acoustic velocity film.

Figures 4B, 4C:
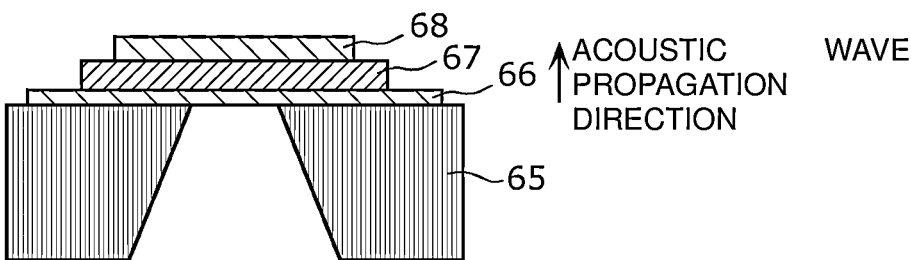
FIG. 4B is a sectional view schematically showing a second example of the acoustic wave resonator defining each filter according to an example of a preferred embodiment of the present invention.
FIG. 4C is a sectional view schematically showing a third example of the acoustic wave resonator defining each filter according to an example of a preferred embodiment of the present invention.

Meanwhile, FIG. 4B is a sectional view schematically showing a second example of the acoustic wave resonator defining each filter according to an example of a preferred embodiment of the present invention. The acoustic wave resonator 60 shown in FIG. 4A represents an example of a preferred embodiment of the present invention in which the IDT electrode 54 is located on the substrate 50 provided with the piezoelectric film 53. Here, the substrate to be provided with the IDT electrode 54 thereon may be a piezoelectric single-crystal substrate 57 including a single piezoelectric layer as shown in FIG. 4B. The piezoelectric single-crystal substrate 57 includes piezoelectric single crystal of $LiNbO_3$, for example. The acoustic wave resonator according to this example of a preferred embodiment of the present invention includes the piezoelectric single-crystal substrate 57 of $LiNbO_3$, the IDT electrode 54, and a protecting layer 58 located on the piezoelectric single-crystal substrate 57 and on the IDT electrode 54.

The multilayer structure, the material, the cut-angle, and the thickness of each of the piezoelectric film 53 and the piezoelectric single-crystal substrate 57 mentioned above may be changed as needed depending on required bandpass characteristics of an acoustic wave filter device. An acoustic wave resonator using a $LiTaO_3$ piezoelectric substrate having a cut-angle different from the aforementioned cut-angle, and the like can also produce similar effects to those of the acoustic wave resonator 60 using the above-described piezoelectric film 53.

Meanwhile, a substrate to be provided with the IDT electrode 54 thereon may include a structure in which a support substrate, an energy confinement layer, and a piezoelectric film are laminated in this order. The IDT electrode 54 is located on the piezoelectric film. A $LiTaO_3$ piezoelectric single-crystal or piezoelectric ceramic material may be used as the piezoelectric film, for example. The support substrate is the substrate that supports the piezoelectric film, the energy confinement layer, and the IDT electrode 54.

The energy confinement layer includes one or more layers. Here, a velocity of a bulk acoustic wave propagating in at least one of these layers is higher than a velocity of an acoustic wave propagating in the vicinity of the piezoelectric film. For example, the energy confinement layer may include a multilayer structure including a low acoustic velocity layer and a high acoustic velocity layer. The low acoustic velocity layer is a film that renders the acoustic velocity of the bulk wave in the low acoustic velocity layer lower than the acoustic velocity of the acoustic wave propagating in the piezoelectric film. The high acoustic velocity layer is a film that renders the acoustic velocity of the bulk wave in the high acoustic velocity layer higher than the acoustic velocity of the acoustic wave propagating in the piezoelectric film. Here, the support substrate may be formed into the high acoustic velocity layer.

Meanwhile, the energy confinement layer may be an acoustic impedance layer having a structure formed by alternately laminating low acoustic impedance layers having relatively low acoustic impedances and high acoustic impedance layers having relatively high acoustic impedances.

In the meantime, FIG. 4C is a sectional view schematically showing a third example of the acoustic wave resonator defining each filter according to an example of a preferred embodiment of the present invention. FIG. 4C shows a bulk acoustic wave resonator serving as the acoustic wave resonator for the filters 11 to 14, 21, and 22. As shown in FIG. 4C, the bulk acoustic wave resonator includes a support substrate 65, a lower electrode 66, a piezoelectric layer 67, and an upper electrode 68, for example. The bulk acoustic wave resonator includes a structure in which the support substrate 65, the lower electrode 66, the piezoelectric layer 67, and the upper electrode 68 are laminated in this order.

The support substrate 65 is a substrate to support the lower electrode 66, the piezoelectric layer 67, and the upper electrode 68. The support substrate 65 is a silicon substrate, for example. Note that the support substrate 65 is provided with a cavity at a portion in contact with the lower electrode 66. This configuration enables free vibration of the piezoelectric layer 67.

The lower electrode 66 is an example of a first electrode located on one surface of the support substrate 65. The upper electrode 68 is an example of a second electrode which is provided on the one surface of the support substrate 65. For example, Al including about 1% of Cu may be used as a material of the lower electrode 66 and the upper electrode 68.

The piezoelectric layer 67 is located between the lower electrode 66 and the upper electrode 68. The piezoelectric layer 67 includes at least one of ZnO (zinc oxide), AlN (aluminum nitride), PZT (lead zirconate titanate), KN (potassium niobate), LN (lithium niobate), LT (lithium tantalate), quartz, and LiBO (lithium boronate) as a main component, for example.

The bulk acoustic wave resonator having the above-described multilayer structure is configured to induce a bulk acoustic wave in the piezoelectric layer 67 by applying electric energy between the lower electrode 66 and the upper electrode 68, thereby generating resonance. The bulk acoustic wave generated by this bulk acoustic wave resonator propagates between the lower electrode 66 and the upper electrode 68 in a direction perpendicular to a film surface of the piezoelectric layer 67. That is to say, the bulk acoustic wave resonator is a resonator using the bulk acoustic wave.

Since the acoustic wave resonator provided to each filter in the multiplexer 1 includes the IDT electrode including the pair of comb-shaped electrodes (see FIGS. 4A and 4B) or includes a pair of parallel-plate electrodes opposed to each other while interposing the piezoelectric layer in between (see FIG. 4C), the impedance of each filter mentioned above exhibits capacitance.

1.3 Multiplexer 500 According to Comparative Example

Now, a description will be given of a multiplexer 500 according to a comparative example, which has a configuration of the related art.

Figure 5:
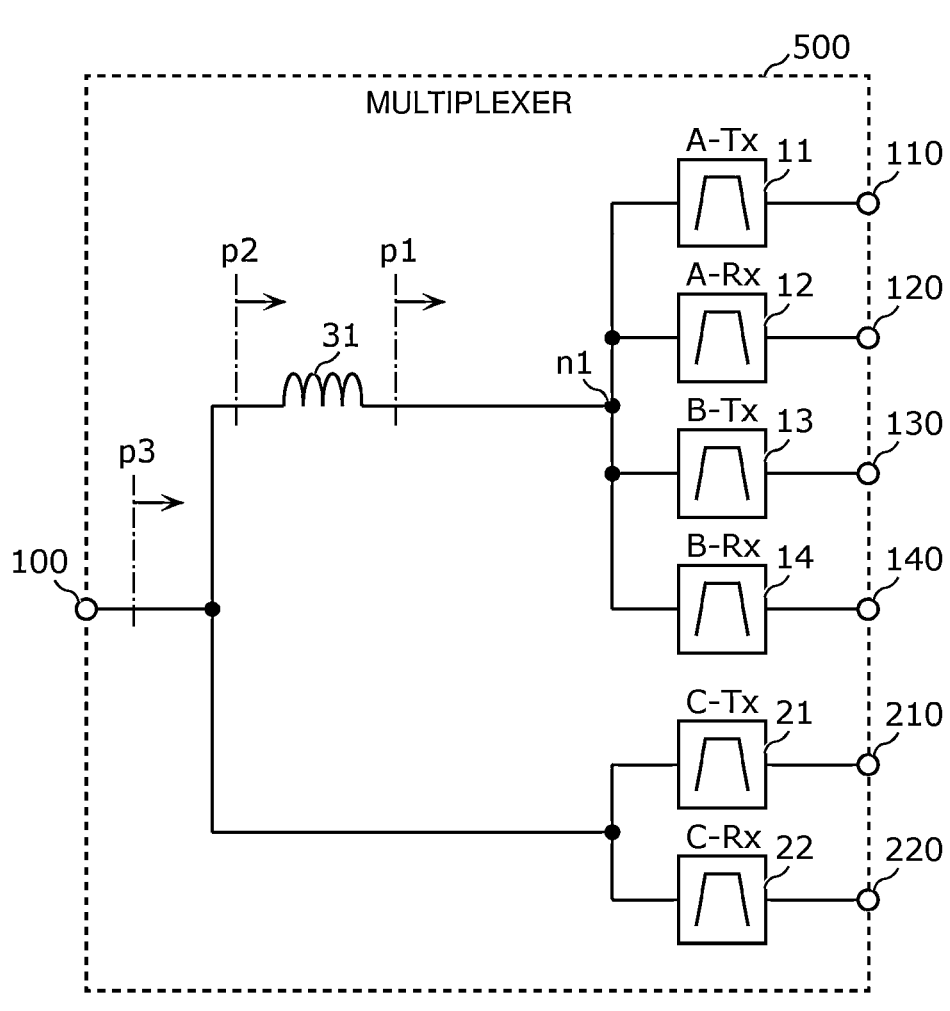
FIG. 5 is a circuit configuration diagram of a multiplexer according to a comparative example.

FIG. 5 is a circuit configuration diagram of the multiplexer 500 according to the comparative example. As shown in FIG. 5, the multiplexer 500 includes the filters 11, 12, 13, 14, 21, and 22, the inductor 31, the common terminal 100, the input terminals 110, 130, and 210, and the output terminals 120, 140, and 220. As compared with the multiplexer 1 according to an example of a preferred embodiment of the present invention, the multiplexer 500 according to the comparative example is different in that the LC parallel resonance circuit 40 is not included therein.

The multiplexer 500 according to the comparative example uses the complex conjugate relationship between the inductive impedance in each of the pass bands (the bands A and B) of the filters 11 to 14 to which the inductor 31 is connected and the capacitive impedance in the above-mentioned pass bands (the bands A and B) of the filters 21 and 22 in an attempt to match the impedance of the multiplexer 500 in the above-mentioned pass bands (the bands A and B) with the reference impedance.

However, in the multiplexer 500 according to the comparative example, there may be a case where the impedance in each of the pass bands (the bands A and B) of the filters 11 to 14 (the first filter group) is located in a region where the capacitance component is large. Here, the larger the number of the acoustic wave filters connected to the inductor 31 is, the larger the capacitance component of the impedance is in each of the pass bands of the first filter group. Accordingly, the impedance in each of the pass bands (the bands A and B) of the filters 11 to 14 in the state where the inductor 31 is connected thereto is shifted clockwise around a constant resistance circle due to the serial connection of the inductor 31, and is located in the inductive region far from the reference impedance. For this reason, an imbalance is caused between the inductive impedance in each of the pass bands (the bands A and B) of the filters 11 to 14 to which the inductor 31 is connected and the capacitive impedance in attenuation bands (the bands A and B) of the filters 21 and 22, which poses a problem that the impedance in each of the pass bands (the bands A and B) of the first filter group of the multiplexer 500 cannot be matched accurately with the reference impedance. As a consequence, a matching loss occurs in the aforementioned pass bands (the bands A and B) whereby the insertion loss of the multiplexer 500 is increased.

1.4 Comparison of Characteristics of Multiplexers According to an Example of a Preferred Embodiment of the Present Invention and Comparative Example Impedance characteristics (admittance characteristics) and bandpass characteristics of the multiplexer 1 according to the present example of a preferred embodiment of the present invention will be described below while comparing the multiplexers of an example of a preferred embodiment of the present invention and the comparative example.

Figure 6:
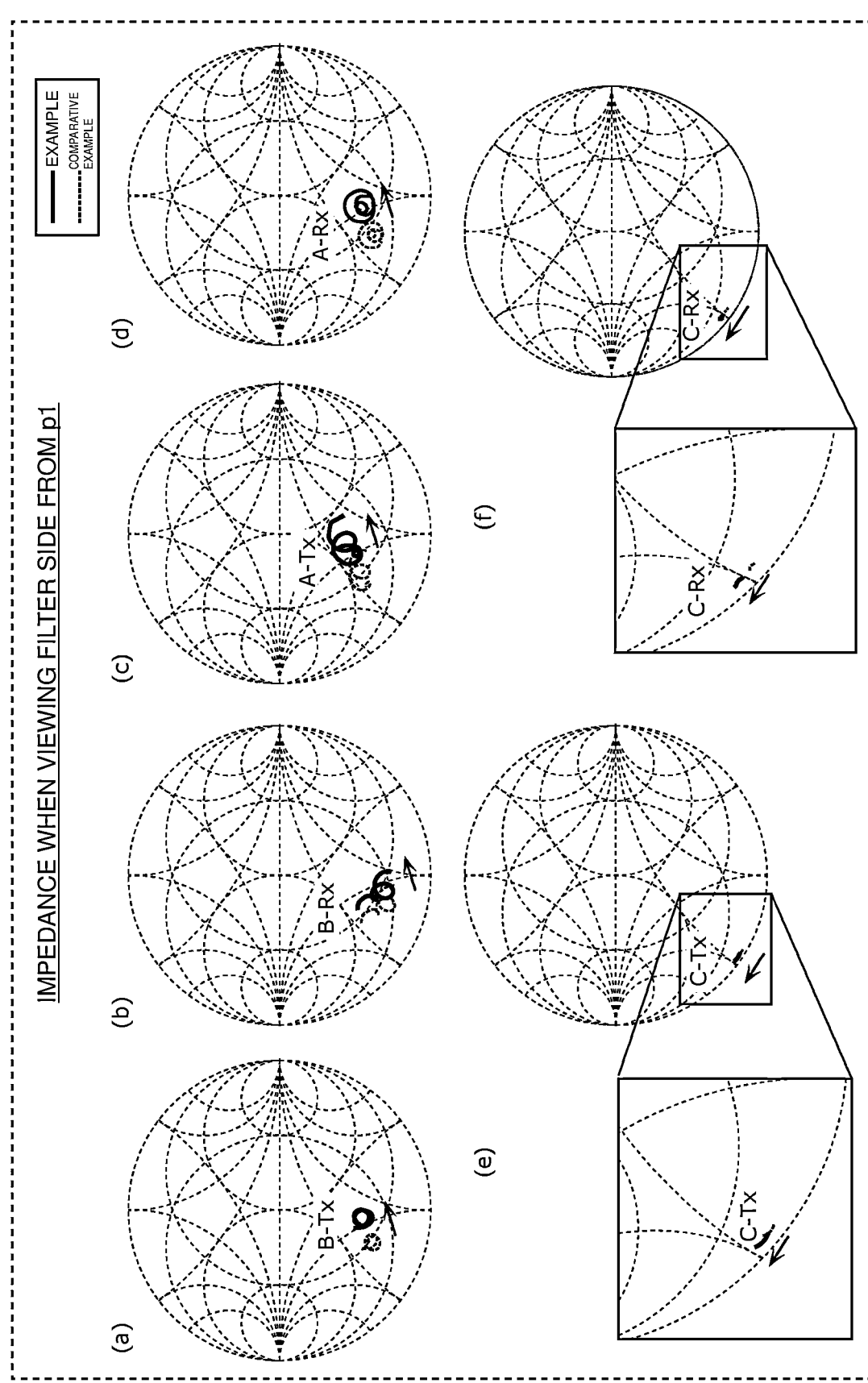
FIG. 6 illustrates Smith charts representing comparison of impedances in a case where first filter groups according to an example of a preferred embodiment of the present invention and the comparative example are viewed from a node p1.

FIG. 6 illustrates Smith charts representing comparison of impedances in the case where the first filter groups according to the example of a preferred embodiment of the present invention and the comparative example are viewed from a node p1. FIG. 6 shows the impedance characteristics in the example of a preferred embodiment of the present invention and the comparative example in the case where the filters 11 to 14 are viewed from the node p1 (the second end of the inductor 31). Here, the node p1 is located between the second end of the inductor 31 and the node n2 (a connecting point of the LC parallel resonance circuit 40).

FIGS. 6A and 6B plot the impedances in the transmission band and the reception band, respectively, of the band B out of the impedances in the case where the filters 11 to 14 are viewed from the node p1. FIGS. 6C and 6D plot the impedances in the transmission band and the reception band, respectively, of the band A out of the impedances in the case where the filters 11 to 14 are viewed from the node p1. FIGS. 6E and 6F plot the impedances in the transmission band and the reception band, respectively, of the band C out of the impedances in the case where the filters 11 to 14 are viewed from the node p1.

In the multiplexer 500 according to the comparative example, all the impedances of the band A, the band B, and the band C in the case where the filters 11 to 14 are viewed from the node p1 are located in the capacitive region.

In contrast, in the multiplexer 1 according to the example of a preferred embodiment of the present invention, the impedances of the band A and the band B located on the lower frequency side relative to the resonant frequency Fr out of the impedances in the case where the filters 11 to 14 are viewed from the node p1 are shifted counterclockwise (toward the reference impedance) around the constant conductance circle due to the inductance of the LC parallel resonance circuit 40 (parallel connection of the inductive components) as compared with the multiplexer 500 according to the comparative example.

Meanwhile, in the multiplexer 1 according to an example of a preferred embodiment of the present invention, the impedances of the band C located on the higher frequency side relative to the resonant frequency Fr out of the impedances in the case where the filters 11 to 14 are viewed from the node p1 are shifted clockwise (toward a short-circuit point) around the constant conductance circle due to the capacitance of the LC parallel resonance circuit 40 (parallel connection of the capacitance components) as compared with the multiplexer 500 according to the comparative example.

That is to say, in the multiplexer 1 according to an example of a preferred embodiment of the present invention, the resonant frequency Fr is located between the band C and the pair of the bands A and B. Thus, the impedances of the band A and the band B in the case where the filters 11 to 14 are viewed from the node p1 and the impedances of the band C in the case where the filters 11 to 14 are viewed from node p1 are shifted in the directions opposite to each other as compared with the multiplexer 500 according to the comparative example.

In other words, in the multiplexer 1 according to an example of a preferred embodiment of the present invention, the impedances of the band A and the band B in the case where the filters 11 to 14 are viewed from the node p1 are located closer to the reference impedance, and the impedances of the band C in the case where the filters 11 to 14 are viewed from the node p1 are located closer to the short-circuit point as compared with the multiplexer 500 according to the comparative example.

Figure 7A:
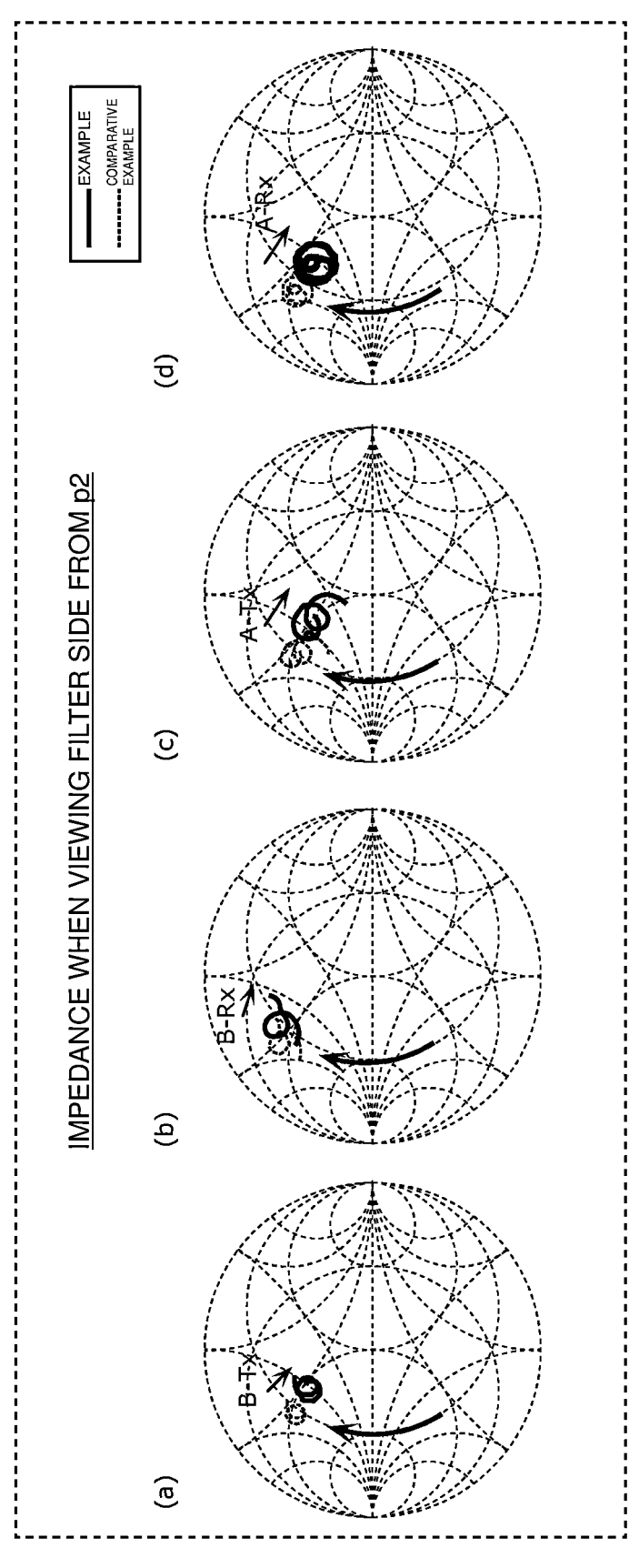
FIG. 7A illustrates Smith charts representing comparison of impedances in the case where the first filter groups according to an example of a preferred embodiment of the present invention and the comparative example are viewed from a node p2.
Figure 7B:
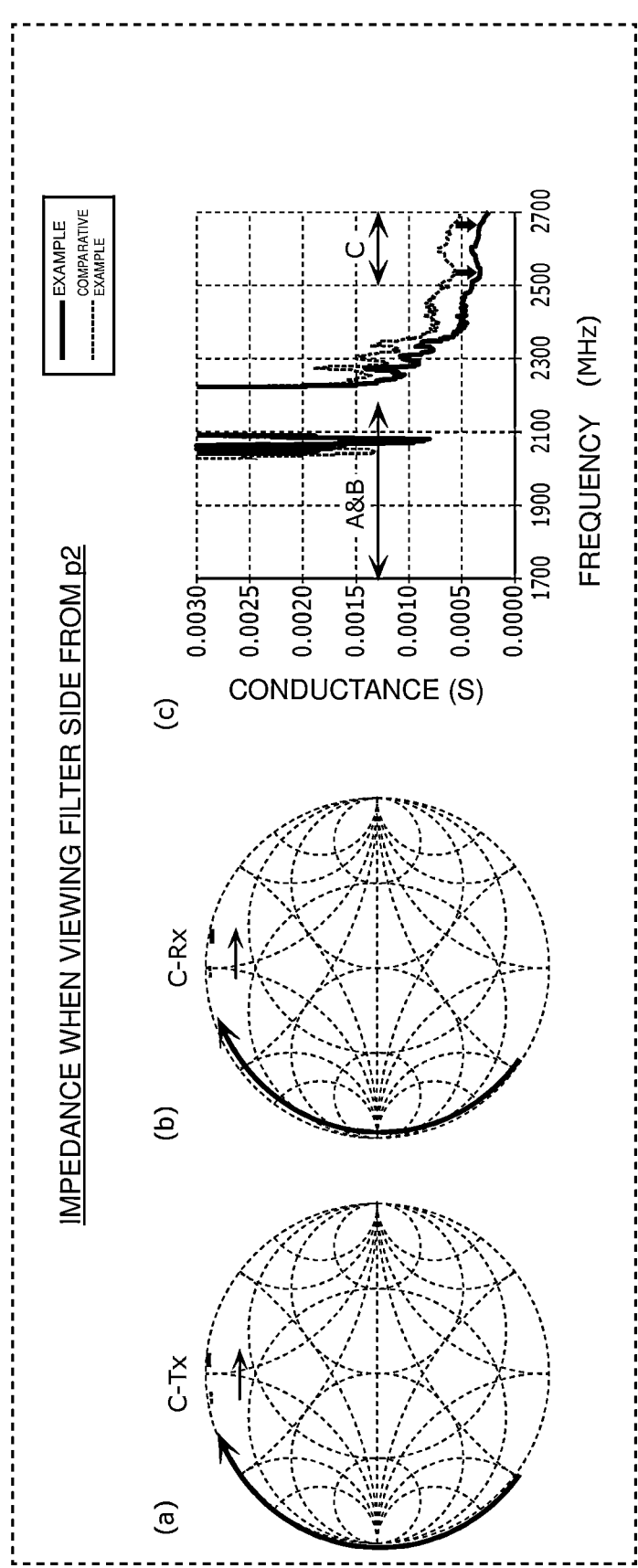
FIG. 7B illustrates Smith charts representing comparison of impedances and a graph that compares conductance values, in the case where the first filter groups according to an example of a preferred embodiment of the present invention and the comparative example are viewed from the node p2.

FIG. 7A illustrates Smith charts representing comparison of impedances in the case where the first filter groups according to an example of a preferred embodiment of the present invention and the comparative example are viewed from the node p2. Meanwhile, FIG. 7B illustrates Smith charts representing comparison of impedances and a graph that compares conductance values, in the case where the first filter groups according to an example of a preferred embodiment of the present invention and the comparative example are viewed from the node p2. Here, the node p2 is located between the first end of the inductor 31 and a connecting point of the inductor 31 to the second filter group.

FIGS. 7A and 7B illustrate the impedance characteristics in an example of a preferred embodiment of the present invention and the comparative example, in the case where the filters 11 to 14 are viewed from the node p2 (the first end of the inductor 31). FIGS. 7A(a) and 7A(b) plot the impedances in the transmission band and the reception band, respectively, of the band B out of the impedances in the case where the filters 11 to 14 are viewed from the node p2. FIGS. 7A(c) and 7A(d) plot the impedances in the transmission band and the reception band, respectively, of the band A out of the impedances in the case where the filters 11 to 14 are viewed from the node p2. FIGS. 7B(a) and 7B(b) plot the impedances in the transmission band and the reception band, respectively, of the band C out of the impedances in the case where the filters 11 to 14 are viewed from the node p2. Moreover, FIG. 7B(c) plots the frequency characteristics of the conductance in the case where the filters 11 to 14 are viewed from the node p2.

In the multiplexer 500 according to the comparative example, all the impedances of the band A and the band B in the case where the filters 11 to 14 are viewed from the node p2 are shifted clockwise around the constant resistance circle due to the inductor 31 connected in series (serial connection of the inductive components) and are located in the inductive region.

In contrast, in the multiplexer 1 according to an example of a preferred embodiment of the present invention, the impedances of the band A and the band B in the case where the filters 11 to 14 are viewed from the node p2 are shifted clockwise around the constant resistance circle due to the inductor 31 connected in series (the serial connection of the inductive components). However, since the positions before the shift are located closer to the reference impedance, the positions after the shift are closer to the reference impedance of the inductive region as compared with the multiplexer 500 according to the comparative example.

Accordingly, the inductive impedance in each of the pass bands (the bands A and B) of the filters 11 to 14 to which the inductor 31 is connected and the capacitive impedance in the attenuation bands (the bands A and B) of the filters 21 and 22 establish a more accurate complex conjugate relationship, so that the impedance in each of the pass bands (the bands A and B) of the first filter group of the multiplexer 1 can be matched with the reference impedance at high accuracy.

Meanwhile, in the multiplexer 1 according to an example of a preferred embodiment of the present invention, the impedances of the band C in the case where the filters 11 to 14 are viewed from the node p2 are shifted clockwise around the constant resistance circle due to the inductor 31 connected in series (the serial connection of the inductive components). However, since the positions before the shift are located closer to the short-circuit point as compared with the multiplexer 500 according to the comparative example, the positions after the shift are closer to an open point of the inductive region. For this reason, the conductance of the band C in the case where the filters 11 to 14 are viewed from the node p2 is reduced as shown in FIG. 7B(c). That is to say, it is possible to reduce or prevent a leakage of a signal in the band C to the first filter group.

Figure 8A:
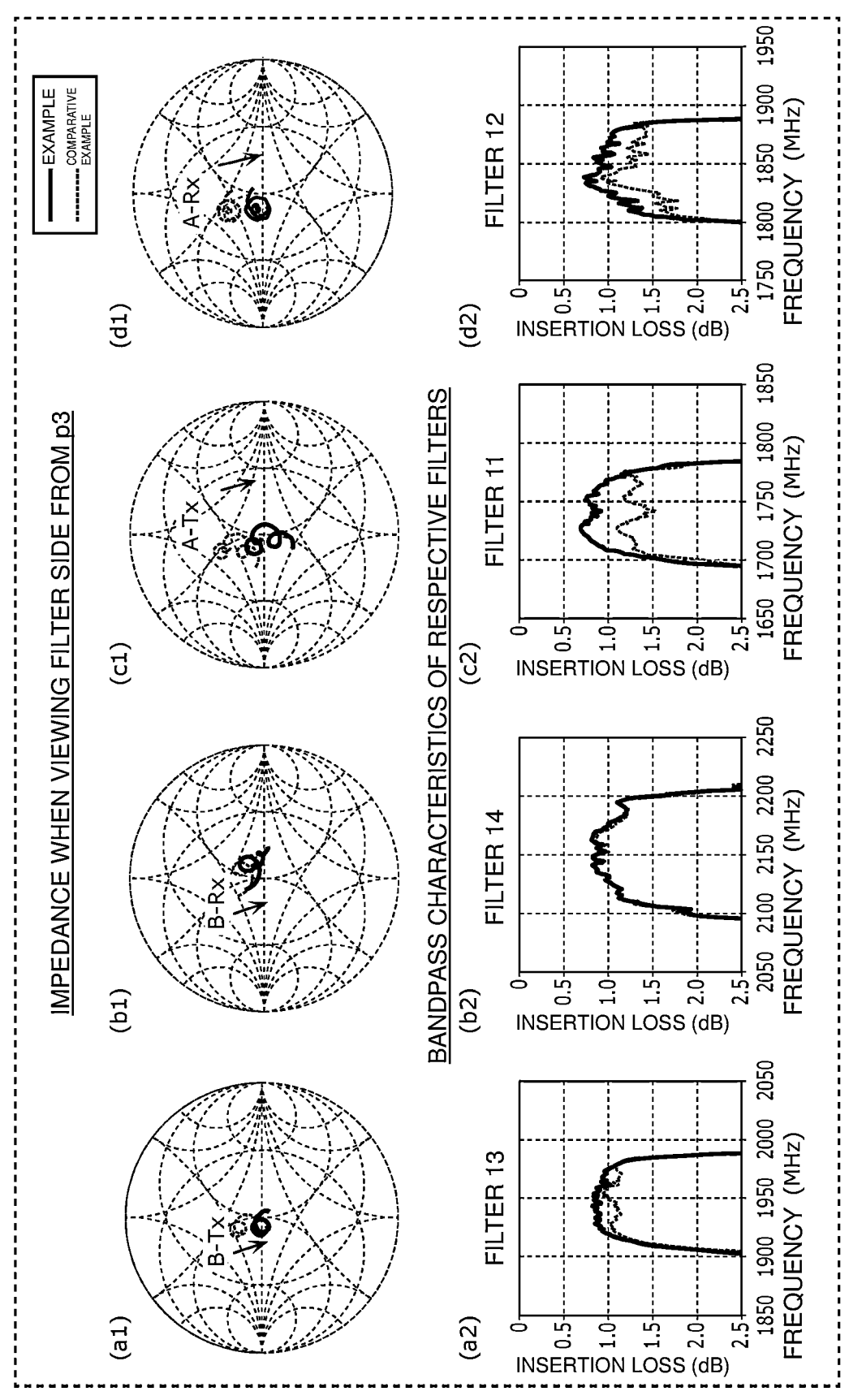
FIG. 8A illustrates Smith charts representing comparison of impedances in a case where each of the multiplexers according to a preferred embodiment of the present invention and the comparative example is viewed from a node p3, and graphs plotting bandpass characteristics of the first filter group.
Figure 8B:
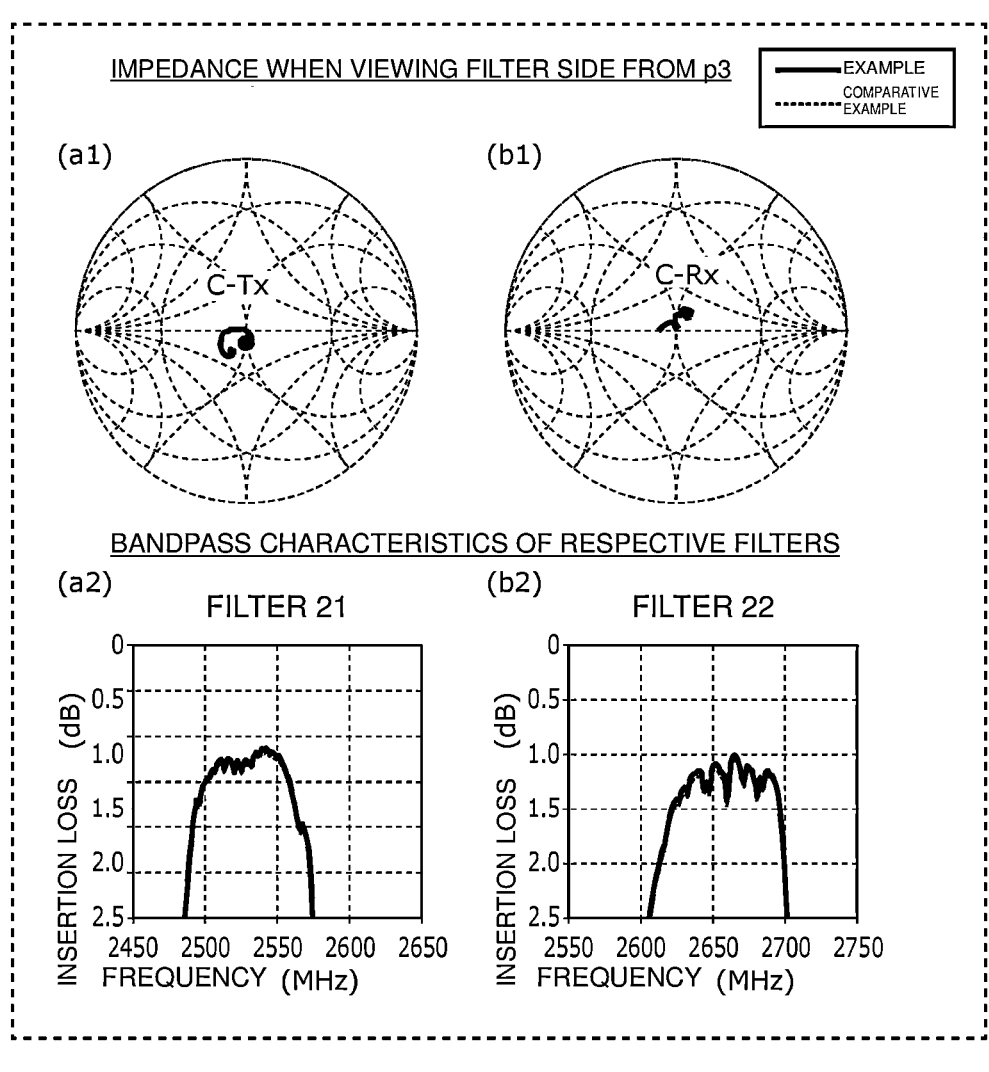
FIG. 8B illustrates Smith charts representing comparison of impedances in the case where each of the multiplexers according to an example of a preferred embodiment of the present invention and the comparative example is viewed from the node p3, and graphs plotting bandpass characteristics of the second filter group.

FIG. 8A illustrates Smith charts representing comparison of impedances in a case where each of the multiplexers according to an example of a preferred embodiment of the present invention and the comparative example is viewed from a node p3, and graphs plotting bandpass characteristics of the first filter group. Meanwhile, FIG. 8B illustrates Smith charts representing comparison of impedances in the case where each of the multiplexers according to an example of a preferred embodiment of the present invention and the comparative example is viewed from the node p3, and graphs plotting bandpass characteristics of the second filter group. Here, the node p3 is located between the common terminal 100 and the connecting point of the inductor 31 to the second filter group.

FIGS. 8A(a1) and 8A(b1) plot the impedances in the transmission band and the reception band, respectively, of the band B out of the impedances in the case where the filters 11 to 14 as well as 21 and 22 are viewed from the node p3. FIGS. 8A(a2) and 8A(b2) plot the bandpass characteristics of the filters 13 and 14, respectively, in the band B. FIGS. 8A(c1) and 8A(d1) plot the impedances in the transmission band and the reception band, respectively, of the band A out of the impedances in the case where the filters 11 to 14 as well as 21 and 22 are viewed from the node p3. FIGS. 8A(c2) and 8A(d2) plot the bandpass characteristics of the filters 11 and 12, respectively, in the band A. FIGS. 8B(a1) and 8B(b1) plot the impedances in the transmission band and the reception band, respectively, of the band C out of the impedances in the case where the filters 11 to 14 as well as 21 and 22 are viewed from the node p3. FIGS. 8B(a2) and 8B(b2) plot the bandpass characteristics of the filters 21 and 22, respectively, in the band C.

As shown in FIG. 8A, in the multiplexer 1 according to an example of a preferred embodiment of the present invention, the impedances of the band A and the band B in the case where the filters 11 to 14 as well as 21 and 22 are viewed from the node p3 are closer to the reference impedance as compared with the multiplexer 500 according to the comparative example. Thus, insertion losses of the filters 13 and 14 are reduced in the band B (the pass band), and insertion losses of the filters 11 and 12 are reduced in the band A (the pass band).

Meanwhile, in the multiplexer 1 according to an example of a preferred embodiment of the present invention, the conductance of the band C in the case where the filters 11 to 14 are viewed from the node p2 is reduced (see FIG. 7B(c)) as compared with the multiplexer 500 according to the comparative example. Accordingly, insertion losses of the filters 21 and 22 are reduced in the band C (the pass band). Thus, it is possible to provide the multiplexer 1 with the reduced insertion losses in the pass bands of the respective acoustic wave filters connected in common.

1.5 Multiplexer 1A According to First Modified Example

Figure 9:
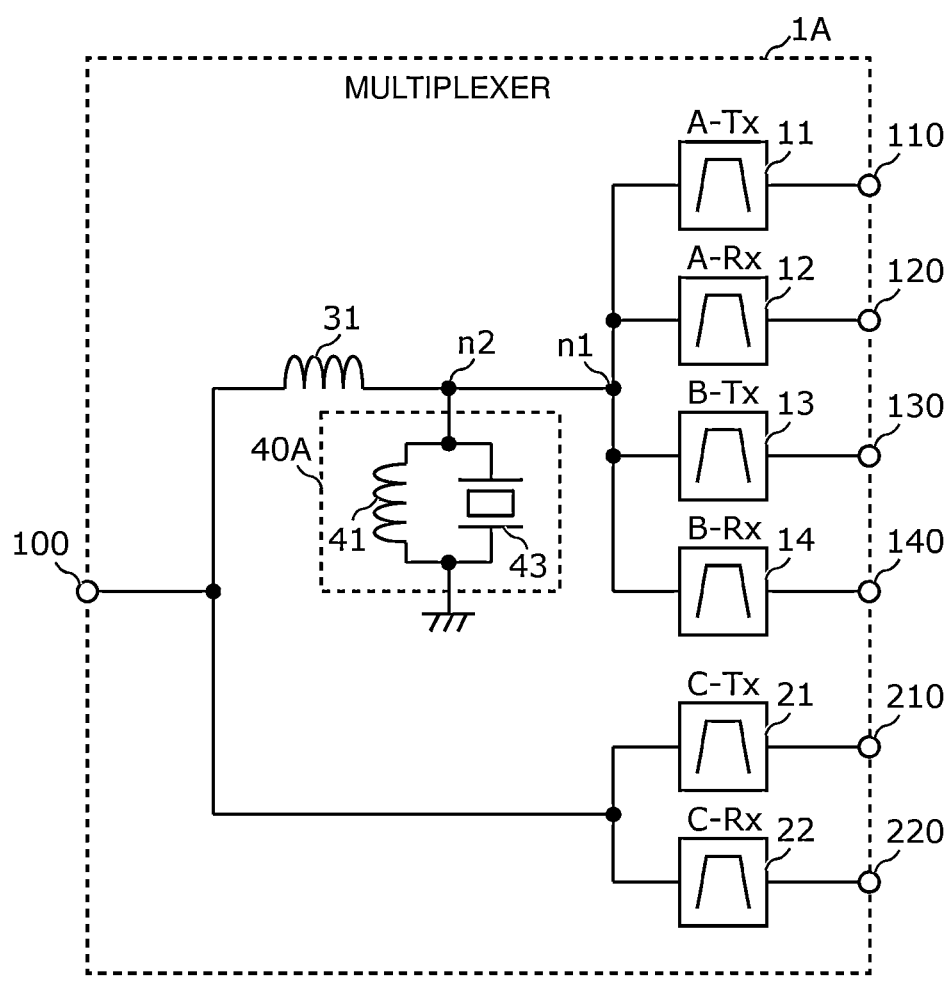
FIG. 9 is a circuit configuration diagram of a multiplexer according to a first modified example of a preferred embodiment of the present invention.

FIG. 9 is a circuit configuration diagram of a multiplexer 1A according to a first modified example of a preferred embodiment of the present invention. As shown in FIG. 9, the multiplexer 1A includes the filters 11, 12, 13, 14, 21, and 22, the inductor 31, a resonance circuit 40A, the common terminal 100, the input terminals 110, 130, and 210, and the output terminals 120, 140, and 220. The multiplexer 1A according to the present modified example of a preferred embodiment of the present invention has a different circuit configuration of the resonance circuit 40A as compared with the multiplexer 1 according to the above-described example of a preferred embodiment of the present invention. The following description will omit explanations of configurations of the multiplexer 1A according to the present modified example which are the same as those of the multiplexer 1 according to the above-described example of a preferred embodiment of the present invention, and will mainly discuss different configurations therefrom.

The resonance circuit 40A is connected between the ground and the node n2 on the path that links the second end of the inductor 31 to the filter 11, and includes the inductor 41 and an acoustic wave resonator 43. The inductor 41 is an example of the second inductance element which is connected between the node n2 and the ground. The acoustic wave resonator 43 is an example of the capacitance element and has the configuration of the acoustic wave resonator 60 shown in FIGS. 4A to 4C. The acoustic wave resonator 43 is connected between the node n2 and the ground. That is to say, the inductor 41 and the acoustic wave resonator 43 are connected in parallel between the above-mentioned path and the ground.

Figure 10:
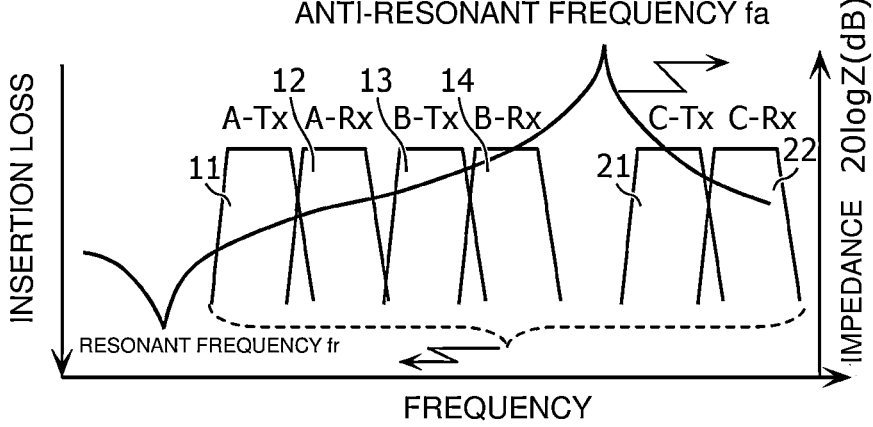
FIG. 10 is a diagram showing a relation of frequencies among respective filters and an LC parallel resonance circuit according to the first modified example of a preferred embodiment of the present invention.

FIG. 10 is a diagram showing a relation of frequencies among the filters 11 to 14 as well as 21 and 22 and the resonance circuit 40A according to the first modified example. As shown in FIG. 10, the resonance circuit 40A has a resonant frequency F1 (a first resonant frequency) and a resonant frequency F2 (a second resonant frequency). The resonant frequency F1 is a frequency at which the impedance of the resonance circuit 40A reaches a maximum. The resonant frequency F1 corresponds to an anti-resonant frequency of the acoustic wave resonator 43. The resonant frequency F2 is a frequency at which the impedance of the resonance circuit 40A reaches a minimum. The resonant frequency F2 corresponds to a resonant frequency of the acoustic wave resonator 43. According to this configuration, the impedance of the resonance circuit 40A exhibits inductance between the resonant frequencies F1 and F2, and the impedance of the resonance circuit 40A exhibits capacitance on the higher frequency side relative to the resonant frequency F1 and the lower frequency side relative to the resonant frequency F2.

Here, the resonant frequency F1 of the resonance circuit 40A is located between the respective pass bands of the first filter group (the filters 11 to 14) and the respective pass bands of the second filter group (the filters 21 and 22), while the resonant frequency F2 of the resonance circuit 40A is located on the lower frequency side relative to the respective pass bands of the first filter group (the filters 11 to 14).

According to this configuration, each of the impedances in the bands A and B of the first filter group is shifted in a center direction along the constant conductance circle due to the inductance of the resonance circuit 40A, and is then shifted to the inductive region along the constant resistance circle due to the inductor 31. On the other hand, each of the impedances in the band C of the first filter group is shifted in a short-circuit direction along the constant conductance circle due to the capacitance of the resonance circuit 40A, and is then shifted to the inductive region along the constant resistance circle due to the inductor 31.

Accordingly, since each impedance in the bands A and B of the first filter group located in the inductive region is shifted in the center direction due to the inductance of the resonance circuit 40A, this impedance is located closer to the reference impedance as compared with the multiplexer without addition of the resonance circuit 40A. It is therefore possible to align a combined impedance (complex conjugate) of each impedance in the bands A and B of the first filter group located in the inductive region and the corresponding impedance in the bands A and B of the second filter group located in the capacitive region accurately with the reference impedance. Thus, a loss in the first filter group can be reduced. On the other hand, the impedance in the band C of the first filter group is shifted to an open (higher impedance) side of the inductive region as compared with the multiplexer without addition of the resonance circuit 40A. It is therefore possible to reduce the conductance in the band C of the first filter group so as to reduce or prevent of a signal in the band C to the first filter group. Thus, a loss in the second filter group can be reduced. As a consequence, it is possible to provide the multiplexer 1A with a reduced insertion loss in the pass band of each of the acoustic wave filters connected in common.

1.6 Multiplexer 1B According to Second Modified Example

Figure 11:
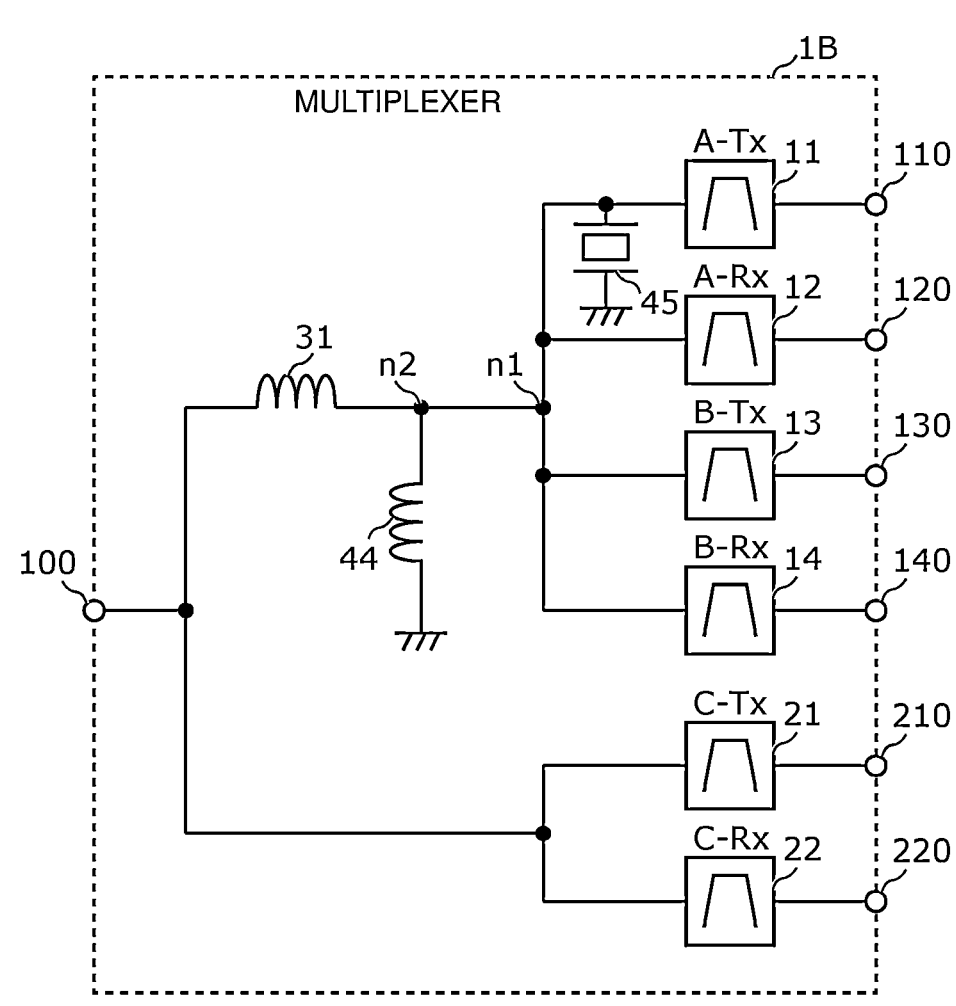
FIG. 11 is a circuit configuration diagram of a multiplexer according to a second modified example of a preferred embodiment of the present invention.

FIG. 11 is a circuit configuration diagram of a multiplexer 1B according to a second modified example. As shown in FIG. 11, the multiplexer 1B includes the filters 11, 12, 13, 14, 21, and 22, inductors 31 and 44, an acoustic wave resonator 45, the common terminal 100, the input terminals 110, 130, and 210, and the output terminals 120, 140, and 220. The multiplexer 1B according to the present modified example has a different connecting position of the acoustic wave resonator defining the LC parallel resonance circuit as compared with the multiplexer 1A according to the first modified example. The following description will omit explanations of configurations of the multiplexer 1B according to the present modified example which are the same as those of the multiplexer 1A according to the first modified example, and will mainly discuss different configurations therefrom.

The inductor 44 is an example of the second inductance element which is connected between the ground and the node n2 on the path that links the second end of the inductor 31 to the filter 11.

The acoustic wave resonator 45 is an example of the capacitance element and has the configuration of the acoustic wave resonator 60 shown in FIGS. 4A to 4C. The acoustic wave resonator 45 is connected between the ground and the path that links the connecting point of the filters 11 and 12 to the filter 11. The acoustic wave resonator 45 is an acoustic wave resonator connected closest to the output end of the filter 11. Here, the acoustic wave resonator 45 may be a capacitor.

According to the above-described configuration, the inductor 44 and the acoustic wave resonator 45 define a resonance circuit that is connected between the ground and the path that links the second end of the inductor 31 to the filter 11.

Here, the resonant frequency F1 of the resonance circuit including the inductor 44 and the acoustic wave resonator 45 is located between the respective pass bands of the first filter group (the filters 11 to 14) and the respective pass bands of the second filter group (the filters 21 and 22), while the resonant frequency F2 of this LC parallel resonance circuit is located on the lower frequency side relative to the respective pass bands of the first filter group (the filters 11 to 14).

According to this configuration, the multiplexer 1B of the present modified example can produce the same effects as those of the multiplexer 1A according to the other modified example. As a consequence, it is possible to provide the multiplexer 1B with a reduced insertion loss in the pass band of each of the acoustic wave filters connected in common.

Here, the acoustic wave resonator 45 may be an acoustic wave resonator defining the filter 11, which may be a parallel arm resonator connected closest to the output end of the filter 11. However, the acoustic wave resonator 45 does not function as the acoustic wave resonator that defines the pass band of the filter 11.

2 Effects and Others

As described above, the multiplexer 1 according to an example of a preferred embodiment of the present invention includes the common terminal 100, the inductor 31 including the first end and the second end, in which the first end is connected to the common terminal 100, the filter 11 connected to the second end and having the first pass band, the filter 21 connected to the common terminal 100 and having the second pass band located on the higher frequency side relative to the first pass band, the inductor 41 connected between the ground and the path that links the second end to the filter 11, and the capacitor 42 connected between the path and the ground. Here, the resonant frequency of the LC parallel resonance circuit 40 including the inductor 41 and the capacitor 42 is located between the first pass band and the second pass band.

According to this configuration, the impedance in the first pass band of the filter 11 is shifted in the center direction along the constant conductance circle on the Smith chart due to the inductance of the LC parallel resonance circuit 40, and is then shifted to the inductive region along the constant resistance circle due to the inductor 31. On the other hand, the impedance in the second pass band of the filter 11 is shifted in the short-circuit direction along the constant conductance circle on the Smith chart due to the capacitance of the LC parallel resonance circuit 40, and is then shifted to the inductive region along the constant resistance circle due to the inductor 31.

In this way, since the impedance in the first pass band of the filter 11 located in the inductive region is shifted in the center direction due to the inductance of the LC parallel resonance circuit 40, this impedance is located closer to the reference impedance as compared with the multiplexer without addition of the LC parallel resonance circuit 40. It is therefore possible to align the combined impedance (the complex conjugate) of the impedance in the first pass band of the filter 11 located in the inductive region and the impedance in the first pass band of the filter 21 located in the capacitive region accurately with the reference impedance. Thus, a loss in the filter 11 can be reduced. On the other hand, the impedance in the second pass band of the filter 11 is shifted to the open (higher impedance) side of the inductive region as compared with the multiplexer without addition of the LC parallel resonance circuit 40. It is therefore possible to reduce the conductance in the second pass band of the filter 11 so as to reduce or prevent of a signal in the second pass band to the filter 11. Thus, a loss in the filter 21 can be reduced. As a consequence, it is possible to provide the multiplexer 1 with a reduced insertion loss in the pass band of each of the filters 11 and 21 connected in common.

Meanwhile, the multiplexer 1 may further include the filter 12 connected to the second end and having the third pass band located on the lower frequency side relative to the second pass band, for example. Here, the resonant frequencies of the LC parallel resonance circuit 40 may be located between the first pass band and the second pass band, and located between the third pass band and the second pass band.

According to this configuration, the impedances in the first pass band and the third pass band of the filters 11 and 12 located in the inductive region are shifted in the center direction due to the inductance of the LC parallel resonance circuit 40, and are therefore located closer to the reference impedance as compared with the multiplexer without addition of the LC parallel resonance circuit 40. It is therefore possible to align the combined impedances (the complex conjugate) of the impedances in the first pass band and the third pass band of the filters 11 and 12 located in the inductive region and the impedances in the first pass band and the third pass band of the filter 21 located in the capacitive region accurately with the reference impedance. Thus, losses in the filters 11 and 12 can be reduced. On the other hand, the impedances in the second pass band of the filters 11 and 12 are shifted to the open (higher impedance) side of the inductive region as compared with the multiplexer without addition of the LC parallel resonance circuit 40. It is therefore possible to reduce the conductance in the second pass band of the filters 11 and 12 so as to reduce or prevent of a signal in the second pass band to the filters 11 and 12. Thus, a loss in the filter 21 can be reduced. As a consequence, it is possible to provide the multiplexer 1 with a reduced insertion loss in the pass band of each of the filters 11, 12, and 21 connected in common.

Meanwhile, in the multiplexer 1, the inductor 41 and the capacitor 42 may be connected in parallel between the path and the ground, for example.

In the meantime, in the multiplexer 1B according to the second modified example, the acoustic wave resonator 45 (the capacitance element) may be connected between the ground and the path that links the connecting point of the filters 11 and 12 to the filter 11 instead of the capacitor 42, for example.

According to this configuration, the inductor 44 (the second inductance element) and the acoustic wave resonator 45 (the capacitance element) define the LC parallel resonance circuit. It is therefore possible to align the combined impedances (the complex conjugate) of the impedances in the bands A and B of the filters 11 and 12 located in the inductive region and the impedances in the bands A and B of the filter 21 located in the capacitive region accurately with the reference impedance. Thus, losses in the filters 11 and 12 can be reduced. On the other hand, the impedances in the band C of the filters 11 and 12 are shifted to the open (higher impedance) side of the inductive region as compared with the multiplexer without addition of the LC parallel resonance circuit. It is therefore possible to reduce the conductance in the band C of the filters 11 and 12 so as to reduce or prevent of a signal in the band C to the filters 11 and 12. Thus, a loss in the filter 21 can be reduced. As a consequence, it is possible to provide the multiplexer 1B with a reduced insertion loss in the pass band of each of the acoustic wave filters connected in common.

Meanwhile, in the multiplexer 1A according to the first modified example, the capacitance element connected between the ground and the path that links the second end to the filter 11 may be the acoustic wave resonator 43, for example.

According to this configuration, it is possible to produce the same effects as those of the multiplexer 1 according to the above-described example of a preferred embodiment of the present invention. As a consequence, it is possible to provide the multiplexer 1A with a reduced insertion loss in the pass band of each of the acoustic wave filters connected in common.

In the meantime, in the multiplexer 1A according to the first modified example, the resonance circuit 40A including the inductor 41 and the acoustic wave resonator 43 may have the first resonant frequency and the second resonant frequency, for example. Here, the first resonant frequency may correspond to an anti-resonant frequency fa of the acoustic wave resonator 43 and the second resonant frequency may correspond to a resonant frequency fr of the acoustic wave resonator 43. The first resonant frequency may be located between the band A and the band C, and the second resonant frequency may be located on the lower frequency side relative to the band A.

According to this configuration, the impedance of the resonance circuit 40A exhibits inductance between the first resonant frequency and the second resonant frequency, and the impedance of the resonance circuit 40A exhibits capacitance on the higher frequency side relative to the first resonant frequency and the lower frequency side relative to the second resonant frequency. It is therefore possible to produce the same effects as those of the multiplexer 1 according to the above-described example of a preferred embodiment of the present invention. As a consequence, it is possible to provide the multiplexer 1A with a reduced insertion loss in the pass band of each of the acoustic wave filters connected in common.

OTHER PREFERRED EMBODIMENTS

The multiplexers according to preferred embodiments of the present invention have been described by discussing the preferred embodiments, and the examples and the modified examples of preferred embodiments of the present invention described above. However, the present invention is not limited to the preferred embodiments, and the examples and the modified examples of preferred embodiments of the present invention described above. The present invention also encompasses modified examples obtained by subjecting the preferred embodiments, the example, and the modified examples described above, to various modifications conceived of by those skilled in the art within the range not departing from the gist of the present invention, and various devices in which the multiplexers according to preferred embodiments of the present invention are embedded.

Meanwhile, a matching element such as an inductor and a capacitor, and a switch circuit may be connected between the elements of the multiplexer according to any of the preferred embodiments, and the examples and the modified examples of preferred embodiments of the present invention described above.

The resonant frequency fr and the anti-resonant frequency fa of the preferred embodiments, the example, and the modified examples are derived by measuring reflection characteristics while bringing RF probes into contact with two input and output electrodes of an acoustic wave resonator, for instance.

Preferred embodiments of the present invention can be widely used in communication devices such as cellular phones as a low-loss multiplexer applicable to frequency standards that are compatible with multiple bands and multiple modes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:

a common terminal;

a first inductance element including a first end connected to the common terminal and a second end;

a first acoustic wave filter invariably connected to the second end and having a first pass band;

a second acoustic wave filter connected to the common terminal and having a second pass band located on a higher frequency side relative to the first pass band;

a second inductance element connected between a ground and a path that links the second end to the first acoustic wave filter; and a capacitance element connected between the path and the ground; wherein a resonant frequency of a resonance circuit including the second inductance element and the capacitance element is located between the first pass band and the second pass band.

2. The multiplexer according to claim 1, further comprising:

a third acoustic wave filter connected to the second end and having a third pass band located on a lower frequency side relative to the second pass band; wherein resonant frequencies of the resonance circuit are located between the first pass band and the second pass band, and located between the third pass band and the second pass band.

3. The multiplexer according to claim 2, wherein the capacitance element is connected between the ground and a path that links a connecting point of the first acoustic wave filter and the third acoustic wave filter to the first acoustic wave filter.

4. The multiplexer according to claim 1, wherein the second inductance element and the capacitance element are connected in parallel between the path and the ground.

5. The multiplexer according to claim 1, wherein the capacitance element is an acoustic wave resonator.

6. The multiplexer according to claim 5, wherein a resonance circuit including the second inductance element and the acoustic wave resonator has a first resonant frequency and a second resonant frequency;

the first resonant frequency corresponds to an anti-resonant frequency of the acoustic wave resonator;

the second resonant frequency corresponds to a resonant frequency of the acoustic wave resonator;

the first resonant frequency is located between the first pass band and the second pass band; and the second resonant frequency is located on a lower frequency side relative to the first pass band.

7. The multiplexer according to claim 1, wherein the common terminal is connected to an antenna.

8. The multiplexer according to claim 1, wherein the first pass band and the second pass band are transmission bands in the Long Term Evolution standard.

9. The multiplexer according to claim 1, wherein each of the first inductance element and the second inductance element is a chip inductor, a conductor coil or a conductor wiring line.

10. The multiplexer according to claim 1, wherein the capacitance element is one of a chip capacitor, a conductor electrode, or a conductor wiring line.

11. The multiplexer according to claim 1, wherein each of the first acoustic wave filter and the second acoustic wave filter includes a piezoelectric substrate and comb-shaped electrodes on the piezoelectric substrate to define interdigital transducer electrodes.

12. The multiplexer according to claim 11, wherein each of the interdigital transducer electrodes includes a multilayer structure including a close contact layer and a main electrode layer.

13. The multiplexer according to claim 12, further comprising a protection layer on the main electrode layer.

14. The multiplexer according to claim 11, wherein the piezoelectric substrate includes a high acoustic velocity support substrate, a low acoustic velocity film, and a piezoelectric film.

15. The multiplexer according to claim 1, wherein each of the first acoustic wave filter and the second acoustic wave filter is a bulk acoustic wave filter operable to generate bulk acoustic waves.

16. The multiplexer according to claim 1, further comprising a matching circuit including an inductor and a capacitor, and a switch circuit.

17. A communication device comprising the multiplexer according to claim 1.

18. The communication device according to claim 17, wherein the communication device is a cellular phone.

\* \* \* \* \*